(12) United States Patent
Tarasinski

(10) Patent No.: US 7,876,104 B2
(45) Date of Patent: Jan. 25, 2011

(54) ELECTRIC INTERFACE ARRANGEMENT FOR THE TRANSMISSION OF ELECTRICAL ENERGY BETWEEN A VEHICLE AND AN OPERATING IMPLEMENT THAT CAN BE COUPLED TO THE VEHICLE

(75) Inventor: Nicolai Tarasinski, Frankenthal (DE)

(73) Assignee: Deere & Company, Moline, IL (US)

( * ) Notice: Subject to any disclaimer, the term of this patent is extended or adjusted under 35 U.S.C. 154(b) by 564 days.

(21) Appl. No.: 11/919,190

(22) PCT Filed: Apr. 26, 2006

(86) PCT No.: PCT/EP2006/061859
§ 371 (c)(1),
(2), (4) Date: Oct. 24, 2007

(87) PCT Pub. No.: WO2006/114437
PCT Pub. Date: Nov. 2, 2006

(65) Prior Publication Data
US 2009/0305519 A1    Dec. 10, 2009

(30) Foreign Application Priority Data
Apr. 26, 2005 (DE) .................. 10 2005 019 362

(51) Int. Cl.
*G01R 31/04* (2006.01)
*B60T 7/16* (2006.01)
*H02P 1/00* (2006.01)

(52) U.S. Cl. .................. 324/503; 324/538; 180/168; 318/139

(58) Field of Classification Search .................. 324/503, 324/538; 290/1 C, 8, 40 A, 40 B, 40 C, 40 R; 180/168; 318/139, 140, 632
See application file for complete search history.

(56) References Cited

U.S. PATENT DOCUMENTS
6,130,487 A * 10/2000 Bertalan et al. .............. 307/9.1

* cited by examiner

*Primary Examiner*—Timothy J Dole
*Assistant Examiner*—Farhana Hoque

(57) ABSTRACT

The invention relates to an electric interface device (11) for transmitting electric power between a vehicle and an implement that can be coupled to said vehicle (42), which is especially an agricultural or industrial utility vehicle. The inventive electric interface device (11) comprises a vehicle interface (14), an implement interface (24), and electric wires (20, 22, 30, 32, 58, 62), by means of which the vehicle interface (14) can be connected to an electric power source (10) of the vehicle (42) and the implement interface (24) can be connected to an electric consumer (12). The vehicle interface (14) is embodied so as to be complementary to the implement interface (24) and can be reversibly connected to the implement interface (24). The invention further relates to a vehicle (42) and an implement encompassing an electric interface device (11). The disclosed electric interface device (11) is characterized by a measuring apparatus (34) that is allocated to the vehicle interface (14) and/or an actuator (52) which is assigned to the vehicle interface (14). The measuring apparatus (34) makes it possible to quantify at least one electric state variable of the electric power transmitted between the vehicle (42) and the implement, and/or the actuator (52) makes it possible to modify at least one electric state variable of the electric power transmitted between the vehicle 42) and the implement.

10 Claims, 3 Drawing Sheets

ELECTRIC INTERFACE ARRANGEMENT FOR THE TRANSMISSION OF ELECTRICAL ENERGY BETWEEN A VEHICLE AND AN OPERATING IMPLEMENT THAT CAN BE COUPLED TO THE VEHICLE

The invention concerns an electric interface arrangement for the transmission of electrical energy between a vehicle and an operating implement that can be coupled to the vehicle. In particular the vehicle is an agricultural or industrial utility vehicle. The electrical interface arrangement includes a vehicle interface, an operating implement interface and electrical lines. The vehicle interface, on the one hand, can be connected by the electrical lines to an electrical energy source of the vehicle and, on the other hand, the operating implement can be connected by the electrical lines to an electrical consumer. The vehicle interface is configured complementary to the operating implement interface and can be connected reversibly with the operating implement interface. Furthermore the present invention concerns a vehicle and an operating implement with an electrical interface arrangement. Furthermore, the present invention concerns a vehicle and an operating implement.

Interface arrangements of the type cited initially have long been known from the state of the art. In particular operating implements and trailers are coupled to vehicles configured in the form of tractors, such implements are provided with electrical consumers. Such electrical consumers may, for example, include electric motors, pumps, fans, lighting arrangements, heating or cooling arrangements, valves, electromagnets, or positioning drives. The electrical consumers of the operating implements or the trailers are supplied by the electrical network of the vehicle, where the electrical network is provided with an electrical energy producer and/or accumulator that may be provided, for example, in the form of a dynamo, a fuel cell, or a generator in the case of an energy generator or in the form of a condenser or a battery or an accumulator or other storage device.

For the supply of electrical energy to operating implements or attached implements an ISO standard 11783-2 is provided among other items that establishes a design standard for the electrical interface between the vehicle and the operating implement. However the actual flow of electrical energy across such an interface is not covered by this standard. Particularly in the case of electrical consumers of an operating implement with a large electrical energy requirement, overload situations can develop in a train consisting of a vehicle and an operating implement that could, under certain circumstances, endanger the operating safety.

Accordingly, the purpose underlying the present invention is to define an electrical interface arrangement of the kind cited above and to further develop it, through which the aforementioned problems are overcome. In particular an electrical interface arrangement is to be defined and developed further with which situations endangering the operating safety can at least be largely avoided.

The purpose is met according to the invention by the teaching of patent claim 1. Further advantageous embodiments and further developments of the invention follow from the subordinate claims.

According to the invention an electrical interface arrangement of the aforementioned kind is characterized by a measuring arrangement associated with the vehicle interface and/or an actuator associated with the vehicle interface. At least one electrical state variable of the electrical energy transmitted between the vehicle and the operating implement can be quantified by the measuring arrangement. At least one electric state variable of the energy transmitted between the vehicle and the operating implement can be varied.

According to the invention it was first recognized that in a conventional arrangement between the vehicle and the operating implement the operating safety is assured within certain limits, for example, by the provision of electrical fuses to protect the electric lines against an overload. However, such fuses only have the effect that the electric current flowing in the individual wiring sections does not exceed a predetermined limiting value, for example, 16 amperes, otherwise the fuse would respond. A response on the part the vehicle to the high load on the electrical consumers on the vehicle itself, for example, in the form of an increase in the rotational speed of the internal combustion engine of the vehicle, may be provided under certain circumstances. However, a consideration of a high load on an electrical consumer of an operating implement that can be coupled to the vehicle is not provided. Particularly in this connection overloads may occur very easily in the electrical energy supply on the part of the vehicle, particularly, for example, if an electric motor of the operating implement is blocked, resulting in a situation comparable to a short circuit.

The electrical interface arrangement, according to the invention, is, in particular, also independent of the number of electrical consumers associated with the operating implement, that can be connected to the vehicle over the electrical interface arrangement. In other words a single interface is only provided even for several electrical consumers. Thereby the electrical consumers may be arranged or provided at any location independently of the electrical interface arrangement.

Therefore, according to the invention, provision is made, for example, to measure the current that is transmitted between the vehicle and the operating implement, in particular, with the measurement arrangement associated with the vehicle interface. In order that the measurement of the electric state variable of the electrical energy transmitted between the vehicle and the operating implement produces the most precise result, the measurement arrangement is associated with the vehicle interface, and hence is in a position to measure or to qualify[1] the actual electrical energy transmitted over the vehicle interface. The actuator is subject to a similar requirement and is also associated with the vehicle interface with which at least one electrical state variable of the electrical energy transmitted between the vehicle and the operating implement can be varied.

[1]Translator's Note: this should probably be "quantify" in order to agree with the rest of the text.

The electrical energy transmitted between the vehicle and the operating implement could be provided in the form of single or multi-phase alternating current, three-phase alternating current also called rotary current and/or direct current. Ideally the interface arrangement, according to the invention, is provided with connections for all types of current, where on the part of the operating implement of the operating implement interface, for example, is provided only with the connection for the transmission of the electric current transmitted that corresponds to the current that the operating implement actually uses. Thereby a vehicle interface can be realized to great advantage that can be applied in many applications to which operating implement interfaces, configured for an individual case, can be connected.

An electrical state variable may be the electric voltage, the electric current, the electrical resistance, the frequency of an alternating current or a rotary current, the position of the phases of an alternating or rotary current, and/or the capacity of an electrical energy storage device. Here ideally provision is also made to equip the vehicle interface with corresponding measurement arrangements that permit a determination of all relevant electrical state variables.

Very particularly preferred provision is made to measure with the measuring arrangement the electric current that flows between the vehicle and the operating implement. On the basis of this electrical state variable a versatile electric energy management system can be attained on the vehicle side that, for example, assures generation of electrical energy on the part of the vehicle or making electrical energy available for the operating implement. For this purpose the rotational speed of an internal combustion engine of the vehicle must be increased under certain circumstances, whereby a generator driven by the internal combustion engine is driven at increased mechanical power, if the electrical current that is to be transmitted is briefly increased on the basis of the load applied on the part of the operating implement.

Now there are in general many possibilities of measuring the electrical voltage of an electrical circuit. In the following preferred embodiments of the voltage measurement arrangements are explained in connection with the electrical interface arrangement according to the invention.

In that way a measurement resistance could be provided on at least one electrical line with which a voltage drop could be measured with a voltage measuring unit. Then the current flowing between the vehicle and the operating implement can be calculated according to Ohm's law.

A measurement resistance could also be provided in at least one line on which a temperature sensor is provided. The temperature sensor detects the temperature, the variation of the temperature or the heating of the measurement resistance and generates measurement signals therefrom. For this purpose a calibration and/or an equalization with the temperature surrounding the vehicle could be required. Preferably a load characteristic is calculated from the heating of the measurement resistance that could be displayed, for example, to an operator on a scale from a minimum to a maximum load of the operating implement.

An electrical fuse could be provided in at least one line, with which a voltage drop could be measured with a voltage measuring unit. Alternatively or in addition the voltage drop in a particular section of the line could be measured with a voltage measuring unit. Moreover the voltage drop at a switching element could be measured with a voltage measuring unit, for example, at the contacts of a switching element. In these cases as well the current flowing between the vehicle and the operating implement or through the corresponding line can be calculated according to Ohm's law.

The provision of a magnetic field sensor is particularly preferred which is arranged in the immediate vicinity of an electric line. The magnetic field brought about by the current flowing through the electric line between the vehicle and the operating implement can be detected or quantified by the magnetic field sensor. The magnetic field sensor could include a Hall sensor or it could operate according to the magneto resistive principle. The magnetic field sensor generates a signal depending on the magnetic field that is conducted to a control arrangement or to the measuring arrangement.

Provision is made, very particularly preferred, for at least one measuring device with which the electrical voltage in the vicinity of the operating implement interface, the vehicle interface, the electric energy source and/or that of an electrical accumulator can be measured. Accordingly a measuring device is provided in each case not only at the vehicle interface or the operating implement interface but also at an electrical energy source of the vehicle, for example, at a generator or a dynamo, and/or at an electrical accumulator, for example, at the vehicle battery. Thereby the actually existing voltage conditions can be measured at the individual locations of the electrical circuit and conducted to a corresponding control arrangement, so that in a particularly advantageous manner an energy management system can be attained for the train consisting of the vehicle and the operating implement that is provided with corresponding control and regulating functions. Moreover thereby comprehensive monitoring and diagnosis functions can be made available with which, for example, an overload of the electrical installation can be avoided.

Preferably the actuator is configured in such a way that the vehicle interface can be switched free of any voltage. This is particularly useful in the case of a manual coupling of the operating implement to the vehicle and/or is required for safety reasons.

It is very particularly preferred if at least one electric state variable can be varied at the vehicle interface by the actuator. Accordingly the vehicle interface includes corresponding devices to permit this. For this purpose, for example, rectifiers, voltage converters or transformers could be used.

According to a preferred embodiment the interface arrangement, according to the invention, includes at least one control arrangement for the control of at least one electrical state variable. The actual current values of the electrical state variable can be compared by the control arrangement with the required input values of the electrical state variable. The actual current values of the electrical state variable can be determined, for example, by the measuring arrangement. If the required input value of the electrical state variable deviates from the current actual value of the state variable in a preferred control strategy an actuator could be used to vary the rotational speed of an internal combustion engine of the vehicle, preferably in such a way that the energy supply of the vehicle and the operating implement is assured and, on the other hand, that the fuel consumption of the vehicle is minimized. In this case the actuator or the actuating arrangement would be the internal combustion engine control arrangement.

As an alternative thereto a control strategy would also be conceivable with which the operating speed of the vehicle is varied in such a way that the deviation is minimized. In this case the actuator or actuating arrangement would be a gearbox control for the continuously variable transmission of a tractor. Another control strategy for a deviation of an actual value from a target value would be that the deviating electric state variable be varied by means of at least one actuator in such a way that the deviations can be minimized, where here the operating speed or the rotational speed of the internal combustion engine could be maintained. Any possible excess electrical energy could be conducted to an electric accumulator. The actuator of the control arrangement could, for example, include individual components or all components of the actuator.

Very particularly preferred the control strategy could provide that the rotational speed of the power take-off shaft of the vehicle be varied in such a way that the deviation can thereby be minimized. In this case the actuator or the actuating arrangement would be a power take-off shaft gearbox control arrangement. The power take-off shaft of the vehicle can transmit mechanical energy to an operating implement coupled to the vehicle, so that the operating implement can also be driven mechanically by the power take-off shaft in addition to the electrical supply for an electric drive of the power take-off shaft. This control strategy could also apply to the torque that is transmitted by the power take-off shaft to the operating implement. It is also conceivable that a combination of the aforementioned strategies could be applied, in particular, to a variation of the operating speed of the vehicle in combination with a variation of the rotational speed of the mechanical power take-off shaft in order to minimize the deviation. Such a control strategy could be used to avoid a high load on an electrical consumer of an operating implement coupled to the vehicle, in case that this is detected by the measuring arrangement. The electric consumer in such an example could conceivably be an electric motor of an operating implement configured as a rotobaler, that drives the harvested crop take-up arrangement (pick-up) of the rotobaler. In case that the train consisting of vehicle and rotobaler is operating at too high a speed and too much straw must be taken up by the harvested crop take-up arrangement, the harvested crop take-up arrangement and therewith the electric motor of the rotobaler driving the harvested crop take-up arrangement could become blocked and bring about a short circuit situation comparable thereto. In order to prevent this the control strategy could prior to this point reduce the operating speed of the vehicle and the rotational speed of the power take-off shaft. In this example the components required for the wrapping of the bale in the baling chamber could be driven by the power take-off shaft. Thereby finally an overload of the electrical network of the vehicle and/or individual electrical consumers of the vehicle can be avoided.

In a particularly preferred embodiment a vehicle control arrangement interacts with the regulating arrangement in such a way that the total power requirement of the vehicle can be optimized and/or that the fuel consumption of the vehicle can be minimized. The vehicle control arrangement could be used to control the internal combustion engine, the gearbox, the power take-off shaft or the power take-off shaft gearbox as well as other electrical consumers (for example, a hydraulic pump) of the vehicle. Accordingly the control strategy for this embodiment is aimed at optimizing the total power output of the vehicle, where this may be referred to the immediate actual operating mode (for example, the plowing with a tractor). Alternatively or in addition the control strategy could have the lowest possible fuel consumption of the vehicle at each actual operating mode as a goal.

It is very particularly preferred in the case of a single-phase or a multi-phase transmission of alternating current across the interface that the voltage and/or the frequency and/or the phase position of the alternating voltage can be varied. This could be initiated, for example, by the vehicle operator.

The provision of at least one prioritizing device is preferred with which the electrical energy supply of the electric consumer provided on the vehicle and the electric consumers of the operating implement can be prioritized. This could be attained, for example, with a control arrangement that controls or regulates the electric energy supply of all relevant electric consumers. The relevant electric consumers are meant to include particularly electric consumers with a large electric energy consumption.

In particular in the presence of extreme situations and not in the least for reasons of safety provision could be made that when a predetermined limit value of an electrical state variable is exceeded the power output of an internal combustion engine of the vehicle could be varied—in particular increased. Automatic safety precaution could also be performed that could, for example, be initiated by a control arrangement which controls or regulates the electric energy supply for all electric consumers. This could include, for example, a reduction of the electric voltage, the electric current, the vehicle speed or turning off the flow of electric energy across the interface.

In the frame of an actual embodiment the vehicle interface could include a receptacle or a connector. Then the operating implement interface could be provided with a connector that is configured complementary to the receptacle of the vehicle interface or a receptacle configured complementary to the connector of the vehicle interface. A configuration of the vehicle interface based on receptacle and connector or the operating implement interface is appropriate for operating implements that must be coupled to the vehicle rapidly and frequently. If necessary the receptacle or the connector could be provided on a corresponding mechanical interface between the operating implement and the vehicle, for example, at a pick-up hitch in the sense of DE 100 65 161 A1, so that under certain circumstances an automatic mechanical and electrical coupling between the operating implement and the vehicle is possible.

For that matter, the reversible connection between the vehicle interface and the operating implement interface could also be made with a clamped connection or a screw connection that preferably is protected against weather effects or water by a housing or a box.

In a very particularly preferred embodiment an evaluation device is provided with which the electrical line, the electric energy and/or the electrical resistance of an electric consumer can be determined. Here the evaluation device could be used, on the one hand, to determine the individual electrical state variable on the basis of signals from sensors and/or detectors or on the basis of measurement resistance. Moreover provision could also be made for the measurement device to analyze the results in terms of several electrical state variables relative to a total situation of the electrical supply of the consumers of the vehicle and the operating implement and conducts it further to a control arrangement so that these can be translated into optimized control strategies for the train.

It is particularly preferred that a warning arrangement be provided with which a vehicle operator can be warned if predetermined electrical state variables are exceeded. Such a warning could be performed, for example, by means of acoustic and/or optical signals.

In order that a vehicle operator be informed at all times about the condition—particularly that of the relevant electrical components—of the vehicle and the operating implement coupled to it, a display unit could be provided with which the electric current, the electric voltage, the electric power output, the load characteristic, the consumer resistance and/or the electric energy could be displayed. Finally such a display unit could display the relevant state variables that are measured or determined by the measurement arrangement of the interface arrangement. The display unit could be configured in the form of an LCD monitor that could be arranged in the operator's cab of the vehicle.

To transmit the electrical state variables measured or detected by the measuring arrangement which are usually represented in analog or digital form, and/or for the transmission of control or regulating commands to the actuator a data interface could appropriately be provided. Preferably the data interface is a standardized data interface, preferably a CAN bus.

In order to obtain the most efficient energy management system for the electrical energy supplied by the energy source of the vehicle or to control electrical energy supplied by the vehicle energy source, a control arrangement could be provided with which the electric energy supply of the electric energy source or of the remaining electric consumers can be controlled or regulated. Preferably the electrical state variables determined by the measurement arrangement can be transmitted to the control arrangement. The control arrangement could control the actuator in order to vary at least one electrical state variable of the electrical energy transmitted between the vehicle and the operating implement.

Relative to a vehicle or an operating implement the aforementioned purpose of the invention is met by the teaching of patent claim 29 or 30. Accordingly, a vehicle, according to the invention, particularly an agricultural or industrial utility vehicle, is characterized by an interface arrangement according to one of the patent claims 1 through 30. An operating implement, according to the invention, that can be coupled to a vehicle is characterized by an interface arrangement according to one of the patent claims 1 through 30. Finally the vehicle, according to the invention, or the operating implement, according to the invention, includes components of the interface arrangement according to one of the patent claims 1 through 30, so that to avoid repetition reference may be made to preceding parts of the description.

There are now various possibilities of embodying and further developing these teachings of the present invention to great advantage. For this purpose reference is made on the one hand to the patent claims subordinate to patent claim 1 and on the other hand to the following explanation of a preferred embodiment of the invention on the basis of the drawing. In connection with the explanation of the preferred embodiment of the invention of the basis of the drawing in general preferred embodiments and further developments of the teaching are explained. The drawing shows in each case schematically:

Figure 1:
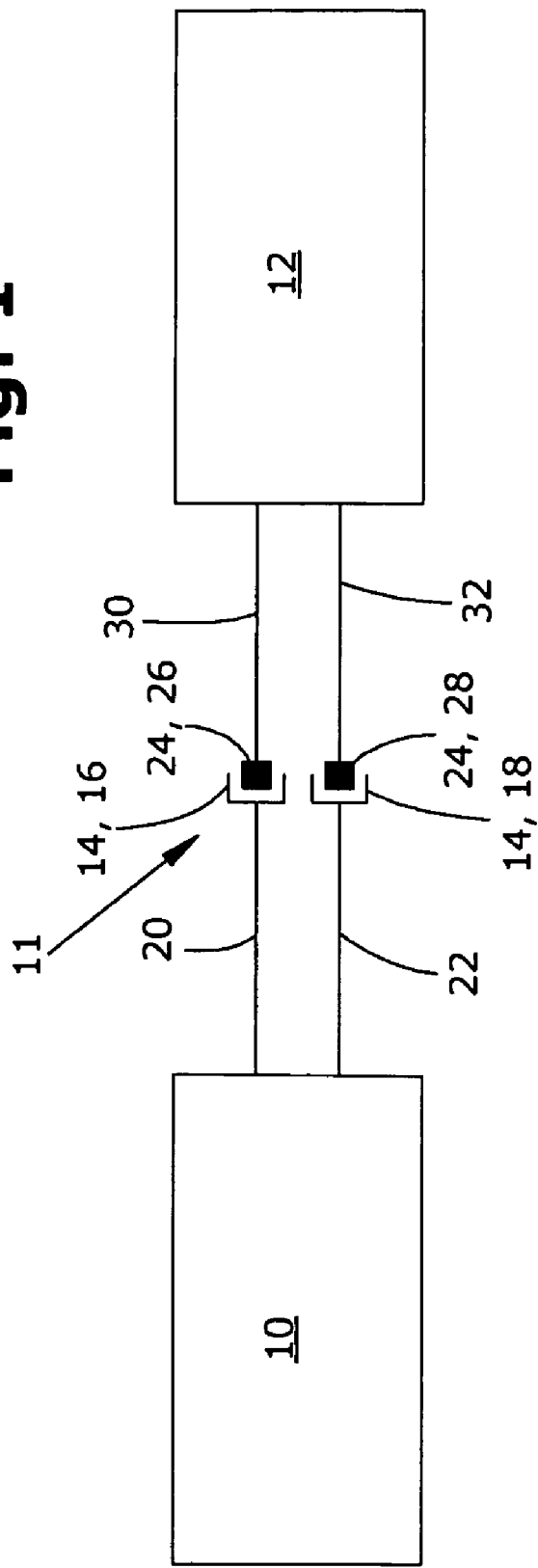
FIG. 1 shows an interface arrangement known from the state of the art.

FIG. 1 shows an electric energy source 10 of a vehicle not shown in FIG. 1. In the electric energy source 10 one is dealing with an electric generator. Beyond that FIG. 1 shows an electric consumer 12 that is associated with an operating implement not shown in FIG. 1. In the case of the electric consumer 12 one is dealing with an electric motor that mechanically drives the shaft—not shown—of the operating implement. The interface arrangement 11 of FIG. 1 includes a vehicle interface 14 that is provided with two receptacles 16, 18. Each of the two receptacles 16, 18 is connected to the electric energy source 10 by the lines 20, 22. The operating implement interface 24 includes two connectors 26, 28 each of which is connected with the electric consumer 12 over the lines 30, 32.

Equal or similar components or groups of components in the figures are associated with the same part number call-outs. Accordingly FIG. 2 also shows an electric energy source 10 configured in the form of an electric generator as well as an electric consumer 12 configured in the form of an electric motor. Here a vehicle interface 14 is also provided with two receptacles 16, 18. The receptacles 16, 18 are connected directly with the electric energy source 10 over the lines 20, 22. An indirect connection of the electric energy source 10 and the vehicle interface 14 would also be conceivable. The interface arrangement 11, according to the invention shown in FIG. 2, includes a measuring arrangement 34 with which an electrical state variable of the electrical energy transmitted between the vehicle and the operating implement can be quantified, in particular the actual voltage drop. The measuring arrangement 34 is associated with a measurement resistance 36 that is provided in the vicinity of the vehicle interface 14 in the line 20. The voltage drop at the measurement resistance 36 can be determined with the measuring arrangement 34. On the basis of the voltage drop the measuring arrangement 34 generates an electrical signal that is a function of the voltage drop and transmits it to the control arrangement 38. The energy management system of the vehicle is controlled or regulated by the control arrangement 38 which is shown only schematically. The control arrangement 38 is connected to the measuring arrangement 34 over a data interface 40 that is configured in the form of a CAN bus. Further units are connected to the data interface 40 which, however, are not shown in FIG. 2. This includes, in particular, the control unit of an internal combustion engine of the vehicle as well as an electronic power control provided for the vehicle.

Figure 3:
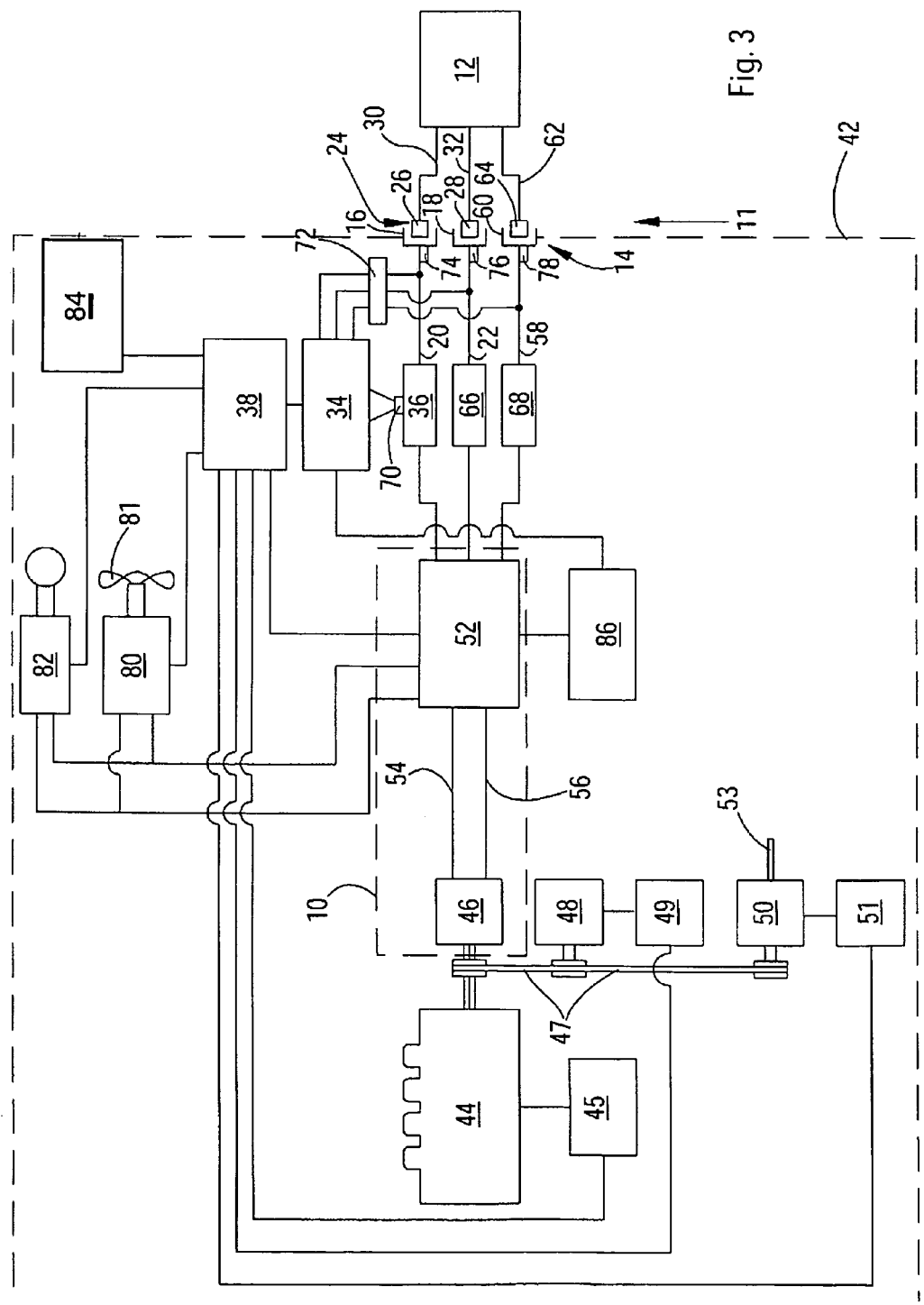
FIG. 3 shows a further embodiment of an interface arrangement according to the invention.

FIG. 3 shows a schematic illustration of a further embodiment of the present invention. Here the components associated with the vehicle are shown in the rectangle 42 drawn in dashed lines, while for the sake of simplicity in the following the vehicle is identified by the part number callout 42. The vehicle 42 includes an internal combustion engine 44 with which the electric generator 46 as well as the gearbox 48 for the forward propulsion of the vehicle 42 and a power take-off shaft drive gearbox 50 can be driven mechanically. In the case of the vehicle 42, one is dealing with a tractor that is provided with a power take-off shaft 53 which follows the power take-off shaft gearbox 50 with which an operating implement can be driven, the implement can be driven purely mechanically and locked to the tractor. The mechanical drive of the electrical generator 46, the gearbox 48, and the power take-off shaft gearbox 50 is identified schematically by the mechanical transmission device 47, where the mechanical transmission device 47 may be a shaft gear ratio arrangement or a gear ratio arrangement, with which the electrical generator 46, the gearbox 48, and the power take-off shaft gearbox 50 could be arranged mechanically in series and/or in parallel. For that matter the operating implement could be driven mechanically or it could be supported by an electric consumer. The internal combustion engine 44 is controlled by the internal combustion engine control arrangement 45. The gearbox 48 is controlled by the gearbox control arrangement 49. The power take-off shaft gearbox 50 is controlled by the power take-off shaft gearbox control arrangement 51. The internal combustion engine control arrangement 45, the gearbox control arrangement 49, and the power take-off shaft gearbox control arrangement 51 are connected to the control arrangement 38 by corresponding connecting lines.

The generator 46 is coupled electrically with the electronic power control arrangement 52. The electronic power control arrangement 52 includes components with which the electric power can be controlled over the vehicle interface 14 to the electric consumers 12 of the operating implement. Accordingly the electric energy source 10 of the vehicle 42 of FIG. 3 includes at least the electric generator 46 and the electronic power control arrangement 52 which are coupled to each other by lines 54, 56.

The electronic power control unit 52 includes a rectifier (not shown) that converts the alternating current generated by the generator 46 into direct current. The electronic power control unit 52 includes a further rectifier (not shown) with which the direct current can be converted into rotary current of a predetermined frequency, phase, voltage and current. Then this rotary current can be supplied to the electric consumer 12 operating implements over lines 20, 22, 58. Inasmuch as the electronic power control unit 52 is provided with the function of an actuator and, for the sake of simplicity, it is also identified by the part number callout 52. The actuator 52 is controlled by the control arrangement 38 in such a way that the vehicle interface 14 can be switched without any voltage. Alternatively or in addition electric state variables of the vehicle interface 14 can be varied by means of the actuator 52 in connection with the control arrangement 38.

Three lines are provided between the electronic power control unit 52 and the operating implement 12 in particular, on the one hand the lines 20, 22, 58 that extend between the electric energy source 10 and the three receptacles 16, 18, 60 of the vehicle interface 14 and on the other hand, the lines 30, 32, and 62 that extend between the electric consumer 12 and the connectors 26, 28 and 64 of the operating implement interface 24. Accordingly in the interface arrangement 11 shown in FIG. 3 one is dealing with an electric interface for the transmission of rotary current between the electric energy source 10 of the vehicle 42 and the electric consumer 12 of the operating implement.

A measurement resistance 36, 66, 68 is provided on each line 20, 22, 58 with which in each case a current measurement can be performed. It is indicated only schematically that a temperature sensor 70 is arranged on the measurement resistance 36 with which the temperature of the measurement resistance 36 can be detected. In the same way temperature sensors (not shown) can also be arranged on the measurement remittances 66 and 68. A voltage measurement arrangement 72 is shown that is also indicated only schematically, with which the immediate applied voltage can be detected, in each case between the lines 20, 22, 58. In the immediate spacial vicinity of the receptacles 16, 18, 60 a magnetic field sensor 74, 76, 78 configured as a Hall sensor is arranged with which the actual existing immediate magnetic field can be detected. The magnetic field can be detected or quantified with a magnetic field sensor 74, 76, 78, this field is brought about by the flow of electric current in each of the lines 20, 22, 58 between the vehicle 42 and the operating implement. A Hal sensor 74, 76, 78 is provided in each case with a fuse (not shown separately) as a unit of components where the current flowing through each of the lines 20, 22, 58 can be limited by the electrical fuse.

The further electric consumers 80, 82 are also supplied with electric current, in this case with alternating current by the electronic power control arrangement or the actuator 52. On the one hand, in the case of the electric consumer 80, one is dealing with the electric motor of a fan 81 for a radiator of a vehicle 42 (not shown in the figure). On the other hand, in the case of the electric consumer 82, one is dealing with the electric motor with which the compressor of the air conditioning arrangement of the vehicle is driven, this is not shown in FIG. 3 in any further detail.

The display arrangement 84 is provided with which one of the state variables predominating at the interface 11 and listed in the following can be displayed: these include the electric current, the electric voltage, the electric power, the power characteristic, the consumer resistance, and/or the electric energy. Furthermore the display unit 84 has the capability of a warning arrangement with which an operator of the vehicle can be warned when a predetermined limit value of the electrical state variable is exceeded. This could be performed by an acoustic and/or an optical signal.

Figure 2:
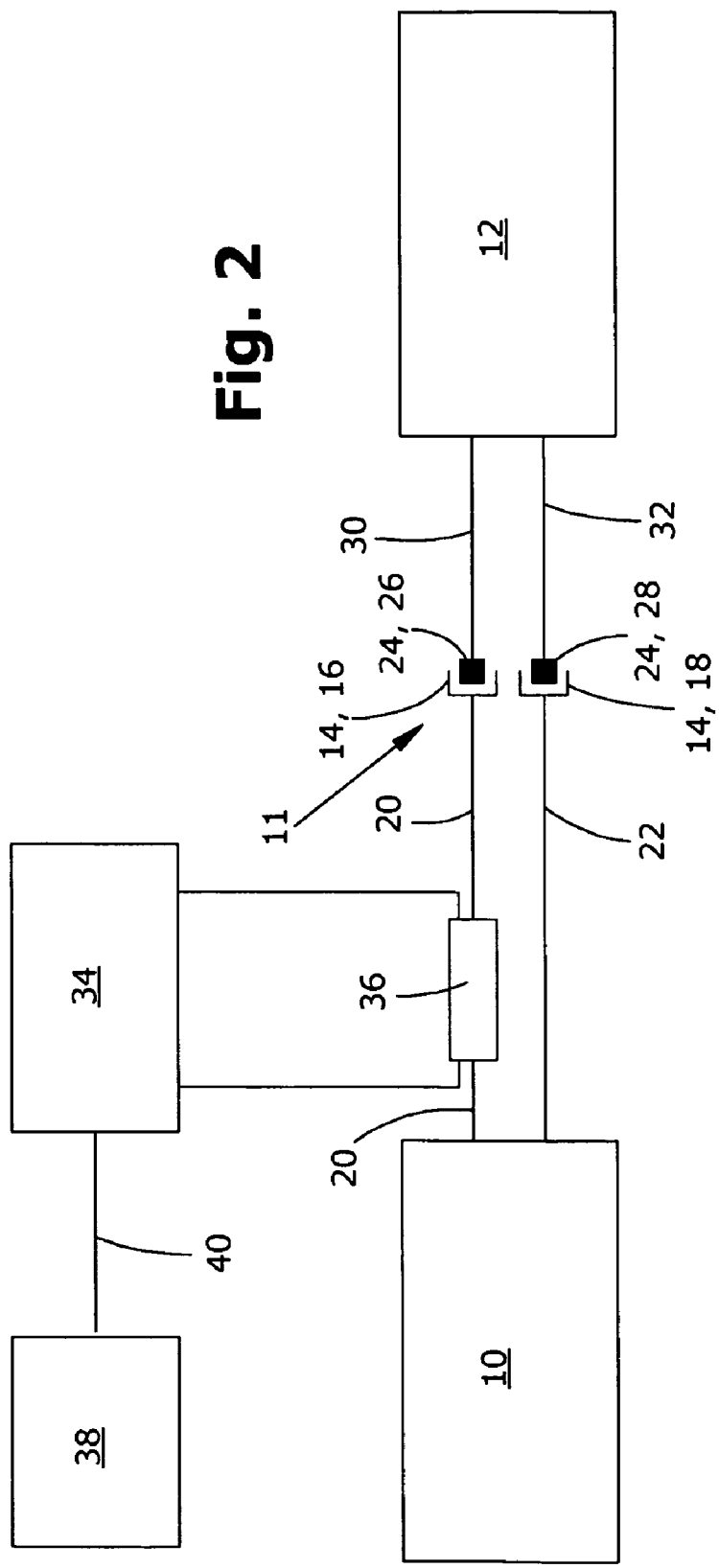
FIG. 2 shows a first embodiment of an interface arrangement according to the invention.

Although this is not shown explicitly in FIGS. 1 through 3, on the basis of a clear illustration of the components provided in this embodiment, the measuring arrangement 34 as well as the actuator 52 in each case is associated with the vehicle interface 14. Further electric consumers 80, 82 are supplied with electric power by the actuator 52 shown in FIG. 3. For this purpose, however, a further separate actuator could also be provided arranged spatially separated from the vehicle interface 14.

In a very particularly preferred way several control strategies can be attained for the operation of the vehicle 42 shown in FIG. 3, particularly as a function of the configuration or the programming of the control arrangement 38. The control arrangement 38 recognizes in particular the electric state variables of the condition transmitted by the measuring arrangement 34 of the electric power transmitted over the interface 11. Moreover the actuator 52 is effectively connected with the internal combustion engine control arrangement 45, the gearbox control arrangement 49, the power take-off shaft gearbox control arrangement 51, as well as the further electric consumers 80, 82. Thereby the rotational speed of the internal combustion engine 44 and/or the rotational speed of the power take-off shaft 53 can be varied (by an appropriate control of the power take-off shaft gearbox 50) and/or by a corresponding control of the gearbox 48, the rotational speed can be increased as a function of the actual existing operating condition of the vehicle 42 with the control arrangement 38 and the rotational speed of the propulsion drive, not shown in FIG. 3, can be controlled or regulated. Thereby, for example, the total power output of the vehicle can be optimized. It is also conceivable that the fuel consumption of the vehicle can be minimized by a corresponding control. A vehicle control required for this purpose is represented by the control arrangement 38, shown in FIG. 3, which simultaneously is provided with the function of a regulating arrangement.

Moreover the control arrangement 38 is provided with the capability of a prioritizing device. The electric energy supply for the electric consumers 80, 82 and the electric consumer 12 of the operating implement can be prioritized by it. This also may be an object of a control or regulating strategy for the vehicle 42.

An electric accumulator 86 is provided that is configured in the form of a condenser with sufficient capacity (for short-term interim storage of electrical energy) or that may be configured in the form of an accumulator. The actual present electrical state variable of the electrical accumulator 86 can also be detected, which is indicated schematically by a connecting line between the accumulator 86 and the measuring arrangement 34.

In closing it should be noted very particularly that the embodiment explained above is provided only for the description of the teaching claimed, but do not limit it to the embodiment.

The invention claimed is:

1. An electrical interface for transmitting electrical energy between a vehicle having an internal combustion engine and an implement coupled to the vehicle, the electrical interface comprising:

a vehicle interface;

an implement interface;

electric lines connecting the vehicle interface with an electric energy source and connecting the implement interface with an electric consumer, the vehicle interface is configured complementary to the implement interface is reversibly connectable to the implement interface;

a sensor associated with the vehicle interface senses an actual value of an electrical state variable quantifying the electrical energy transmitted between the vehicle and the implement;

an actuator is associated with the vehicle interface varying the actual value of the electrical state variable; and a control unit for controlling the electrical state variable, the control unit comparing the actual value of the electrical state variable with a pre-determined target value, and when the actual value of the state variable deviates from the pre-determined target value the control unit causing the actuator to vary a rotational speed of the engine to minimize said deviation.

2. The interface of claim 1, wherein:
the control unit compares target values of the parameter with actual values of the parameter; and
the control unit varies an engine speed of the vehicle when an actual value deviates from the target value in order to minimize vehicle fuel consumption.

3. The interface of claim 1, wherein:
the control unit varies the speed of the vehicle by controlling a gearbox control unit.

4. The interface of claim 1, wherein:
the control unit controls a power take-off shaft gearbox control unit to control a rotational speed of a power take-off shaft of the vehicle.

5. The interface of claim 1, wherein:
the control unit controls an actuator to control the electrical parameter to minimize the deviation.

6. The interface of claim 1, wherein:
the control unit interacts with a regulating system to optimize total power output of the vehicle.

7. The interface of claim 1, wherein:
the interface transmits alternating current, and the control unit varies a characteristic of the current upon initiation by a vehicle operator.

8. The interface of claim 1, wherein:
the control unit prioritizes electrical energy supply for the electrical consumers.

9. The interface of claim 1, wherein:
the vehicle interface includes a first connector and the implement interface includes a second connector which mates with the first connector.

10. The interface of claim 1, further comprising:
an evaluation device for measuring an electric parameter of the electric consumer.

* * * * *